(12) United States Patent
Elgamil

(10) Patent No.: US 10,396,624 B2
(45) Date of Patent: Aug. 27, 2019

(54) ELECTROMAGNETIC TORQUE MOTOR WITH HIGH TORQUE AND LIMITED ANGLE

(71) Applicant: Mohamed Ahmed Elgamil, Haram (EG)

(72) Inventor: Mohamed Ahmed Elgamil, Haram (EG)

( * ) Notice: Subject to any disclaimer, the term of this patent is extended or adjusted under 35 U.S.C. 154(b) by 0 days.

(21) Appl. No.: 15/567,117

(22) PCT Filed: Mar. 30, 2016

(86) PCT No.: PCT/EG2016/000011
§ 371 (c)(1),
(2) Date: Oct. 17, 2017

(87) PCT Pub. No.: WO2016/169572
PCT Pub. Date: Oct. 27, 2016

(65) Prior Publication Data
US 2018/0102687 A1 Apr. 12, 2018

(30) Foreign Application Priority Data
Apr. 21, 2015 (EG) ................................ 2015040617

(51) Int. Cl.
*H02K 7/065* (2006.01)
*H02K 9/04* (2006.01)
(Continued)

(52) U.S. Cl.
CPC ............... *H02K 7/065* (2013.01); *H01F 7/14* (2013.01); *H01F 7/145* (2013.01); *H02K 7/075* (2013.01);
(Continued)

(58) Field of Classification Search
CPC .......... H02K 7/065; H02K 7/075; H02K 7/18; H02K 9/04; H02K 26/00; H02K 33/00;
(Continued)

(56) References Cited

U.S. PATENT DOCUMENTS 434,517 A    8/1890   Lockard
3,221,191 A * 11/1965   Cuches ................... H01F 7/145
                                                     310/216.021
(Continued)

FOREIGN PATENT DOCUMENTS

CN       105186821 A    12/2015
CN       205004967 U    1/2016

*Primary Examiner* — Bickey Dhakal
*Assistant Examiner* — Zemenay T Truneh
(74) *Attorney, Agent, or Firm* — KA Filing LLC; Wayne V. Harper

(57) ABSTRACT

The torque motor as disclosed depends on decreasing the gap between a surface on a fixed part and a corresponding inclined facing surface on a rotating part, where the gap width is proportional to its distance from the angle vertex, in magnifying the electromagnetic force and its resulting torque. Therefore, the surface on the fixed part starts directly at—or close to—a point in align with the rotating part center of rotation, and hence the gap width is minimum at the start point and increases away from this point due to the inclination angle. The motor includes features, such as, utilizing many pairs of facing surfaces, many electromagnetic circuits; arrange the surfaces in pairs for balanced forces, works in one or two directions, the two directions electromagnetic circuits installed in one or two levels, and precautions and ways to avoid magnetic field interference and leakage.

11 Claims, 3 Drawing Sheets

(51) Int. Cl.
*H02K 7/075* (2006.01)
*H02K 7/18* (2006.01)
*H02K 26/00* (2006.01)
*H02N 11/00* (2006.01)
*H01F 7/14* (2006.01)
*H02K 33/00* (2006.01)
*G01R 5/14* (2006.01)
*H02K 1/27* (2006.01)

(52) U.S. Cl.
CPC .................. *H02K 7/18* (2013.01); *H02K 9/04* (2013.01); *H02K 26/00* (2013.01); *H02N 11/006* (2013.01); *G01R 5/14* (2013.01); *H02K 1/27* (2013.01); *H02K 33/00* (2013.01)

(58) Field of Classification Search
CPC ...... H01F 7/145; H02N 11/00; H02N 11/006; G01R 5/14
USPC .................................. 318/689, 119; 324/146
See application file for complete search history.

(56) References Cited

U.S. PATENT DOCUMENTS

| | | | |
|---|---|---|---|
| 3,638,550 A * | 2/1972 | Hereford | G03B 9/22 396/470 |
| 4,321,571 A * | 3/1982 | Meyer | H01F 7/145 335/181 |
| 4,845,424 A * | 7/1989 | Gamble | G01R 5/14 324/146 |
| 5,038,063 A * | 8/1991 | Graber | H01F 7/145 310/115 |
| 5,293,093 A * | 3/1994 | Warner | H02K 26/00 310/156.12 |
| 7,880,410 B2 * | 2/2011 | Mohler | H02K 33/00 318/119 |
| 2007/0018513 A1 * | 1/2007 | Yamamoto | H02K 1/141 310/49.26 |

* cited by examiner

ELECTROMAGNETIC TORQUE MOTOR WITH HIGH TORQUE AND LIMITED ANGLE

TECHNICAL FIELD

The present invention relates to a torque motors with limited angular displacement.

BACKGROUND ART

Torque motors are motors that provide turning torque to produce angular displacement of value depends on the load or the control type. Electromagnetic devices are ones of the used motors, especially when the turning angle is small. Piezoelectric motors of ceramic stacks can also be used to generate high turning torque with limited small angular displacement.

Electromagnetic torque motors vary by varying their coils locations, methods of coil connections, and if these motors have permanent magnets or not.

BRIEF SUMMARY OF THE INVENTION

Torque motors of piezoelectric actuators can generate high torque, but their too short limited strokes make it difficult to provide the required turning angle. Electromagnetic torque motors do not generate high torques as compared with those of piezoelectric ones, but they can generate considerable turning angles, and thus they are more common. Electromagnetic torque motors' performance is not only limited by their limited generated toques, but also the inertia of their moving parts consumes major values of the generated torques. Consequently, their inertia limits the speed of response in applications that require high speed of response.

In this invention, the torque motor utilizes the closeness of the rotating part surface to the facing fixed part surface, which inclines in small angle, especially the closeness near the angle vortex, to magnify the electromagnetic pulling force between the two surfaces and the resulting torque. Therefore, the fixed part surface starts in align with the rotating part center of rotation where the gap is at its smallest possible width. This width increases when going away from this starting point due to the inclination angle. The fixed part surface start should be aligned or close to the aligned point with the rotating part center of rotation, additionally, the rotating parts, the fixed parts and the center of rotation are positioned in such a way that the two facing surfaces can completely touching each other without gaps when the angle between them is zero. Designs can vary in several configurations such as utilizing more than one pair of facing surfaces, and distributing these pairs so as to vanish the resulting forces and generates pure turning couple torques only. It is also possible to utilize two groups in one or more levels, each group work in one of the two directions of rotation. Surfaces' forms and dimensions should be selected in all possible ways to avoid any interference leads to generate torques opposing the required drive direction.

BRIEF DESCRIPTION OF DRAWINGS OF THE INVENTION

Figure 6:
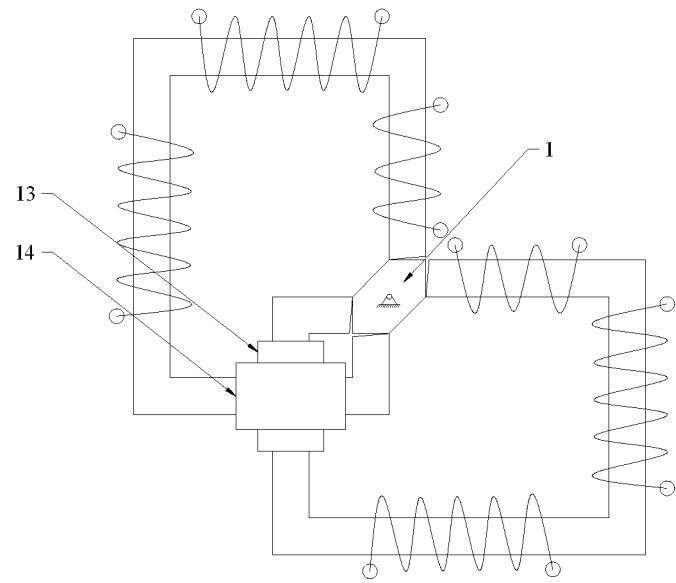
Figure 7:
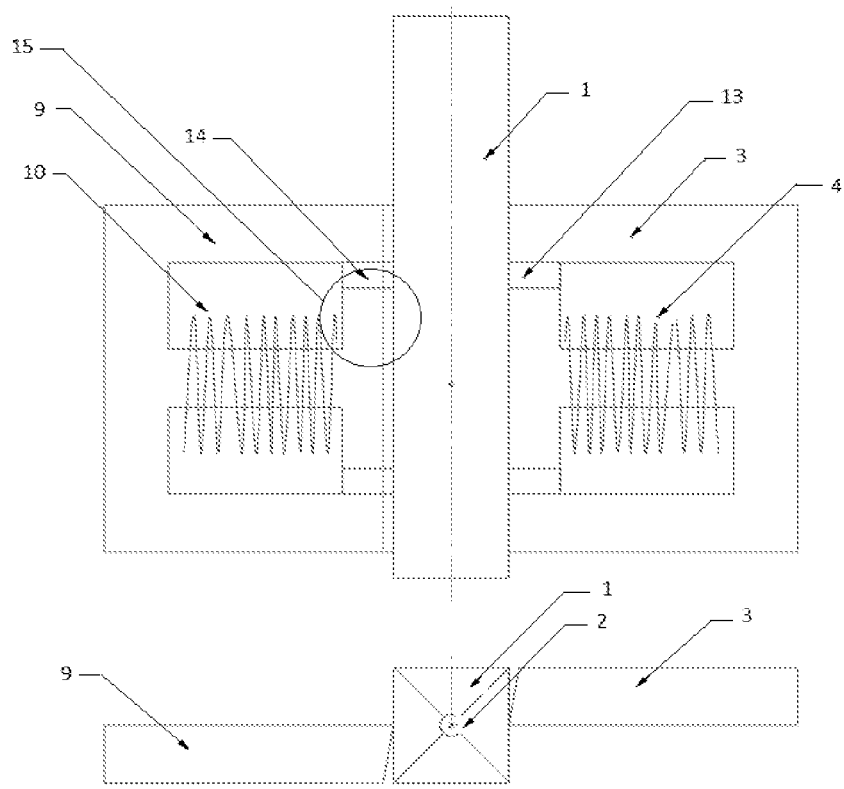

FIG. 6 shows an example of using two force balanced groups to turn the electromagnetic torque motor in the two directions, and using flux isolators to reduce leakage and interference at intersections, in accordance with an exemplary embodiment of the present disclosure; and FIG. 7 shows other examples for the fixed and rotating parts arrangements, in accordance with an exemplary embodiment of the present disclosure.

BRIEF DESCRIPTION OF THE INVENTION

Figure 1:
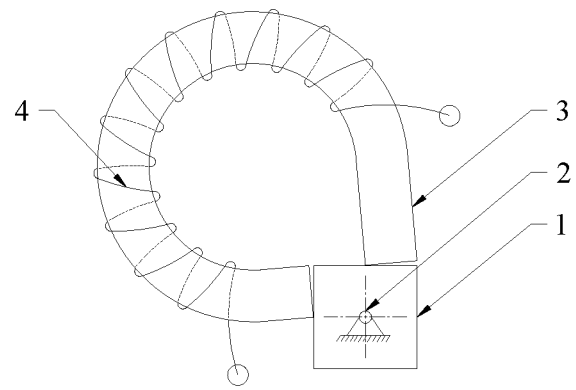
FIG. 1 shows main parts of an electromagnetic torque motor example that applies to the invention, in accordance with an exemplary embodiment of the present disclosure.

FIG. 1 shows main items of the torque motor in an example to apply the invention, where part (1) is the rotating part, which can be a shaft of a torque motor, or the shaft in a device requested to be turned without need to be coupled with an external actuator, especially when inertia reduction is crucial. The rotating part (1) turns about the center of rotation (2). The fixed part (3) complete the electromagnetic circuit when its two ends' faces become close to the two corresponding surfaces on the rotating part, where the electric coil (4) is the electromagnetic flux generator. When the electromagnetic coil is fed with current, the electromagnetic flux is generated and then works to shorten the gap between the faces at the two ends of the fixed part and the corresponding faces on the rotating part. Because of the facing surfaces located on one side with respect to the center of rotation, the resulting generated pulling force is thus shifted from the center of rotation to that side and then it generates a torque works to turn the rotating part. In the example shown in FIG. 1, the two forces generated at both the fixed part ends work to pull the corresponding two faces on the rotating part to turn it in counter clock wise direction.

Figure 2:
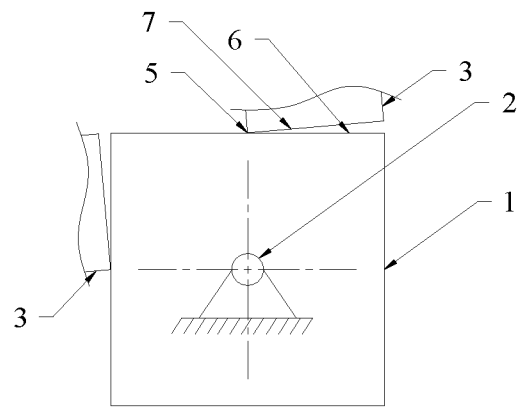
FIG. 2 shows a close-up of rotation part in the example shown in FIG. 1 with the fixed part two ends and the facing surfaces, in accordance with an exemplary embodiment of the present disclosure.

FIG. 2 shows a zoom in on the rotating part (1) of the example described in FIG. 1, its center of rotation (2) and the two ends of the fixed part (3). The end of the fixed part starts at the point (5) in align with the center of rotation, or near that point, and then it extends its surface (7) towards one side of the center of rotation (2) so as to not generating opposing torque. The fixed part surface (7) and the corresponding rotating part surface (6) are inclined to each other, and thus they come closer and the gap width reduced when the distance from point (5) becomes shorter. The force generated from the electromagnetic flux is inversely proportional to the square of the gap width, and thus it increases with decrease of the inclination angle and the associated decrease in the gap width.

The gap width increases with the increase of the distance from point (5), calling it distance (x), then the gap width value can be approximated as (x) multiplied by the inclination angle in radians. Consequently, the pulling force at distance (x), which is inversely proportional to the square of the gap width, is also inversely proportional to the square of distance (x). The torque due to the local force at distance (x) equals the force times its arm (the distance (x)). Combining the two relations, it could be concluded that the local torque is inversely proportional to the distance (x). In other words, the torque increase also when its generating force become closer to point (5), and the inverse proportionality is with the distance (x) and not its square. The total torque is then calculated by integrating the local torque from point (5) to the end of facing zone of the two corresponding surfaces. This analysis is just for explaining the idea and not the actual calculations.

Figure 3:
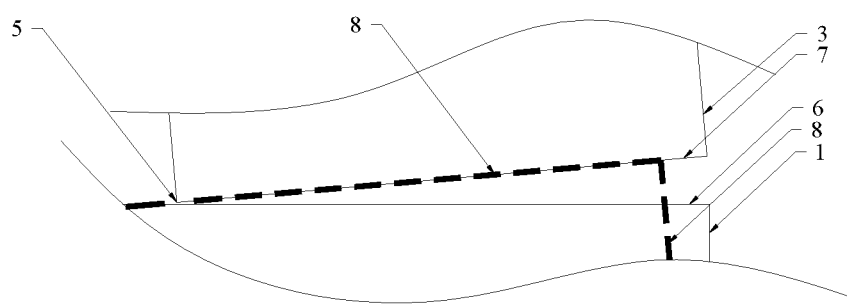
FIG. 3 shows a close-up of the facing surfaces in FIG. 1 and the position of the rotating part as its stroke end, in accordance with an exemplary embodiment of the present disclosure.

FIG. 3 is more closeup to the gap to show how accurate is the previous approximation of the geometrical relations, and to help in determining more accurate relations if required. It shows the case when the rotating part (8) completely touches the fixed part and the two facing surfaces (6) and (7) are completely touching reach other without gaps. The figure shows that the gap width doesn't equal zero even at point (5) unless the two surfaces are completely touching each other.

It could be noted that the surface (6) doesn't cover the surface (7) completely when reaching the position (8) in this example.

Figure 4:
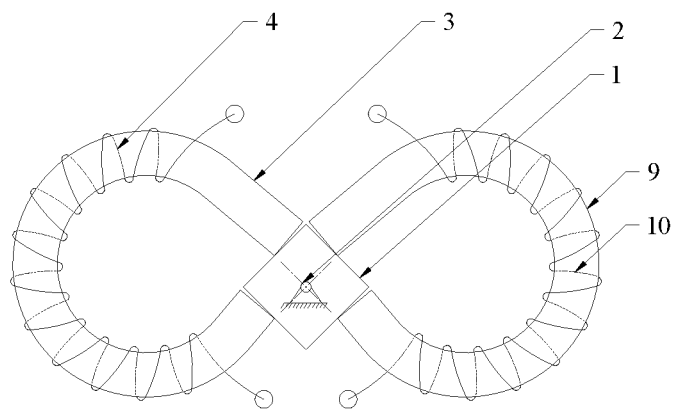
FIG. 4 shows an example of how the torque motor can work in the two directions of rotation, in accordance with an exemplary embodiment of the present disclosure.

The fixed part (9) and its electric coil (10) are added in the example shown in FIG. 4 to enable generating torques in clockwise direction and thus the motor can work in both directions.

Figure 5:
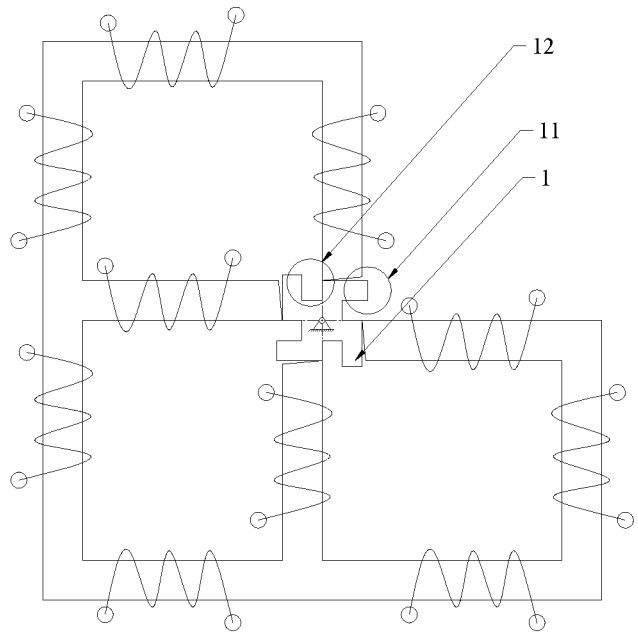
FIG. 5 shows how to use more than two parts of facing surfaces, and electromagnetic circuits as well in order to increase the torque: and shows some improvement examples such as force balancing, avoiding facing surfaces area reduction and decreasing the magnetic flux leakage, in accordance with an exemplary embodiment of the present disclosure.

The example in FIG. 5 shows how to utilize several pairs of facing surfaces and several electromagnetic circuits, where more than the shown four pairs and three circuits can be utilized. In addition to obtaining more torque, the forces are balanced and therefore there is no transverse resultant force. Even if only two pairs are utilized as shown in FIG. 1, they can be arranged to obtain pure couples without transverse forces. The rotating part is extended at zone (11) to cover all the fixed surface area when turning contrary to the case shown in FIG. 3. The rotating part surface is modified at zone (12) to reduce the possibility of generating opposing torque due to flux leaking. Adding flux isolators can furtherly improve the performance.

FIG. 6 shows a third example that utilizes two fixed parts to work in the two directions, each of them is arranged to generate pure couples without transverse forces. If both are in the same level or close to each other, flux isolators such as (13) and (14) could be used to decrease leakage.

Features described for the fixed part (3), where its two ends are facing two different faces of the rotating part, are not the only possible configurations that can be used. For example, fixed parts can have more than one end, where all of them face the same surface of the rotating part. FIG. 7 shows two fixed parts (3) and (9), each of them has three ends facing the same surface of the moving part (2). Both of the fixed parts work to turn the rotating part in the same direction in this case. Top and frontal views are used for more explanation. To increase the facing surfaces and hence the generated torques, the middle facing part (15) of the fixed part (9) is shaped in the form of the letter (T). Flux isolators (13) and (14) could also be used to prevent the improper leakage at different gaps between fixed and rotating parts.

The torque motor generates high torque at small stroke angles, where the torque increases with the decrease of the inclination angle between the corresponding faces of the fixed and rotating parts. These motors are suitable for machine such as wire forming machines. Current machine use cams for certain product, or electric servo motors with speed reducers or pneumatic and hydraulic actuators for programable multipurpose machines. If the powerful torque motors are used, simple, of low cost and easy to be controlled multipurpose programable machines can be built.

Other important application is the torque motor of servovalves. Prevailing motors can't directly drive them without intermediate amplifiers. This motor can provide the required driving torque for many of such applications. Besides, it can be built as integrated part of the device in order to reduce the inertia and increase the speed of response.

What is claimed is:

1. An electromagnetic torque motor having a limited angular displacement, the electromagnetic torque motor comprising:
   a rotating part having one or more entirely flat surfaces; and
   one or more fixed parts, each fixed part having two or more ends, each end of the fixed part having a surfaces facing the one or more corresponding surfaces on the rotating part,
   wherein facing surfaces of the rotating part and the one or more fixed parts are separated with gaps, which are of zero value when the facing surfaces of the rotating and the one or more fixed parts are in the closest position, and when the rotating part is displaced, the gap therebetween is generated,
   wherein one or more entirely flat surfaces of the fixed part starts from a point in align with a center of rotation of the rotating part, and are angularly inclined along one side of the rotating part, and in that such angular inclination of the fixed part extends from the point in align with the center of rotation of the rotating part and towards an end portion of the rotating part to enable the gaps between the facing surfaces of the fixed and rotating parts, such that the gap width between the two facing surfaces is smallest at a vertex side of the angular inclination, and largest along opposite side of the vertex.

2. The electromagnetic torque motor as claimed in claim 1, wherein the fixed part facing surface at its end starts at a point in align with the center of rotation of the rotating part and extends in one side of the center of rotation in such a way that its generated pulling electromagnetic forces produce torques in one direction.

3. The electromagnetic torque motor as in claimed in claim 1, wherein the two facing pair surfaces that generate pulling forces are distributed in such a way that they generate torques in the same direction and doesn't oppose each other.

4. The electromagnetic torque motor as claimed in claim 1, wherein the closeness between the facing surfaces of the fixed and rotating parts due to their inclination and existence near the angle vertex are utilized.

5. The electromagnetic torque motor as claimed in claim 1, wherein the two facing surfaces at the two fixed part ends are facing two surfaces on the rotating part in such a way that the resultant of the electromagnetic pulling forces is zero force and a pure torque couple.

6. The electromagnetic torque motor as claimed in claim 5, wherein more than one facing surfaces pair and one electromagnetic circuit are utilized.

7. The electromagnetic torque motor as claimed in claim 6, wherein surface pairs are arranged in such a way that no contradiction between torques, and related forces are balanced.

8. The electromagnetic torque motor as claimed in claim 6, wherein more than one electromagnetic group can be used to generate torques in one direction or in the two directions of rotation.

9. The electromagnetic torque motor as claimed in claim 8, wherein the groups can be built in one level along a plain or in several levels along more than one plain.

10. The electromagnetic torque motor as claimed in claim 1, further comprising flux isolators to prevent flux leakage or interference in the electromagnetic torque motor.

11. The electromagnetic torque motor as claimed in claim 1, wherein permanent magnets are used to improve the performance of the electromagnetic torque motor.

* * * * *